(12) United States Patent
Cardwell et al.

(10) Patent No.: US 8,193,122 B2
(45) Date of Patent: Jun. 5, 2012

(54) SUPERCONDUCTOR FABRICATION

(75) Inventors: David Anthony Cardwell, Cambridgeshire (GB); Nadendla Hari Babu, Cambridgeshire (GB); Yun-Hua Shi, Cambridgeshire (GB)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 13/173,267

(22) Filed: Jun. 30, 2011

(65) Prior Publication Data
US 2011/0319268 A1   Dec. 29, 2011

Related U.S. Application Data

(62) Division of application No. 11/793,846, filed on Oct. 18, 2007, now Pat. No. 8,003,072.

(30) Foreign Application Priority Data

Dec. 23, 2004  (GB) .................................. 0428319.8

(51) Int. Cl.
*H01L 33/00* (2010.01)
(52) U.S. Cl. ........................................ 505/330; 505/729
(58) Field of Classification Search .................. None
See application file for complete search history.

(56) References Cited

OTHER PUBLICATIONS

"*Handbook of Superconducting Materials*", vol. 1, Section B2.4.3.3, pp. 353-390, Published by United Kingdome Institute of Physics 2003; edited by Cardwell and Ginely, 2003.
McGinn et al *Effects of Processing Variables on the Magnetic Properties of Melt-Processed Yba2Cu3OX*; Yeung et al; Physica C 290 (1997) p. 334-344; Elsevier Science B.V., 1997.
Tagami et al "*Fabrication and Growth rate estimation of PrBa2Cu3O7 Delta Single Crystal by the modified top Seeded Crystal Putting Method*"; Physica C 250 (1995) p. 240-246.
Tagami et al "*Characterization of PrBa2Cu3O7Delta Single Crystals Crown by Crystal Pulling Method Using MgO Crucible*"; Elsevier Science B.V, 1994; Physica C 235-240 (1994) p. 361-362, 1994.

*Primary Examiner* — Timothy Speer
(74) *Attorney, Agent, or Firm* — John B. Hardaway, III; Nexsen Pruet, LLC

(57) ABSTRACT

A seed crystal for the fabrication of a superconductor is grown from a rare-earth oxide having the basic formula $X_w Z_t Ba_x Cu_y O_z$, X comprising at least one rare-earth element and Z being a dopant which raises the peritectic decomposition temperature ($T_p$) of the oxide. In a preferred embodiment, the dopant is Mg. Use of this rare-earth oxide material for seed crystals increases the temperature at which cold-seeding can be performed and thus enables the growth of a wider range of bulk superconductor materials by this process.

15 Claims, 6 Drawing Sheets

SUPERCONDUCTOR FABRICATION

This application is a divisional application of U.S. patent application Ser. No. 11/793,846, which was filed on Oct. 18, 2007 now U.S. Pat. No. 8,003,072.

The invention relates to a new seed crystal, material and method for fabicating superconductors, and to superconductors fabricated thereby.

BACKGROUND TO THE INVENTION

The process whereby bulk X—Ba—Cu—O material (where X comprises at least one rare-earth element such as La, Ce, Pr, Nd, Pm, Sm, Eu, Gd, Tb, Dy, Ho, Er, Tm, Yb, Lu or Y) high-temperature superconductors (HTS) are manufactured has been the subject of considerable scientific development over the last ten years. For the avoidance of doubt, in this document the term rare-earth element includes Y as well as the lanthanides.

Large-grain bulk X—Ba—Cu—O materials have significant potential for generating large magnetic fields, in excess of those achievable with conventional permanent magnets, for a variety of engineering applications such as magnetic bearings, MRI (magnetic-resonance imaging) and flywheel energy-storage applications.

One known technique for producing bulk superconductors is top-seeded melt growth (TSMG), in which a seed crystal is used to control the heterogeneous nucleation of a large superconductor grain. The TSMG technique is generally used to fabricate large single-grain superconductors and also very large superconductor tiles, using multiple seeds.

Since X—Ba—Cu—O materials are iso-structural and their melting point increases as the ionic radius of the rare-earth element(s) X decreases, higher-melting-point materials or systems can be used as seed crystals for lower-melting-point materials or systems. The melting point or peritectic decomposition temperature ($T_p$) is about 1070° C. (±10° C.) for La, Nd, and Sm systems, decreasing to about 980° C. for the Yb—Ba—Cu—O system.

In order to fabricate large, single-grain Y—Ba—Cu—O superconductors, whose melting point is about 1010° C., small crystals of the Nd—Ba—Cu—O or Sm—Ba—Cu—O systems are generally used as seed crystals in the TSMG method. Large tiles of Y—Ba—Cu—O superconductors have been processed successfully for various applications using this method.

LRE (light-rare-earth) systems can be denoted (LRE)-Ba—Cu—O and LRE elements include, for example, La, Nd, Sm, Eu, and Gd. Mixed-rare-earth (MRE) systems include more than one rare-earth element, for example, (Y, Nd)—Ba—Cu—O or (Nd, Sm, Gd)—Ba—Cu—O.

The superconducting properties, such as transition temperature ($T_c$), critical current density ($J_c$) and irreversibility field ($H_{irr}$), of LRE systems or MRE systems are generally superior to that of the Y—Ba—Cu—O system. For MRE systems, enhanced levels of irreversibility field and critical current density may be achieved if one or more of the rare earth elements incorporated is or are light-rare-earth elements.

Although the properties of (LRE)-Ba—Cu—O materials are particularly favourable for potential superconducting applications, (LRE)-Ba—Cu—O samples have not been routinely fabricated in the form of single grains using the TSMG process. This is due primarily to the unavailability of a suitable seed crystal, i.e. a seed crystal having the same crystal structure as the desired superconductor and a higher melting point or $T_p$. If a seed crystal does not have a higher melting point than the desired product superconductor it melts during TSMG fabrication and, therefore, does not seed the growth of the superconductor.

One seed crystal that has been used to fabricate high-melting-point superconductor systems is MgO. This material has a 22% lattice mismatch with the X—Ba—Cu—O system, which is a disadvantageously large mismatch, and also suffers from wetting problems. Therefore, it has low success in producing a desired bulk LRE superconductor and it is not a viable commercial seed crystal.

To overcome the seed crystal problem, many researchers have used a technique called "hot seeding". In this method an X—Ba—Cu—O sample is first melted at well above its $T_p$ and then cooled to just above the $XBa_2Cu_3O_d$ solidification temperature before a small X—Ba—Cu—O seed crystal of the same material is added to the sample surface.

This method is not very practical for processing on an industrial scale, however, because it needs a specially-designed furnace to place a seed crystal at the required position on the melt at elevated temperature while controlling the processing atmosphere. Controlling the processing atmosphere is very important and is critical in inhibiting the formation of a solid solution, in which the LRE element substitutes onto the Ba site, or vice versa. In addition, a small perturbation in oxygen content may affect the seeding process and also depress the material's $T_c$, thereby yielding a fully-processed sample with poor superconducting properties.

SUMMARY OF THE INVENTION

The invention provides a seed crystal, a rare-earth oxide material and a method of fabricating a superconductor as defined in the appended independent claims, to which reference should now be made. Advantageous and preferred features of the invention are set out in dependent subclaims.

In a first aspect the invention may advantageously provide a seed crystal for the fabrication of a superconductor, grown from a rare-earth oxide system having the basic formula $X_wZ_tBa_xCu_yO_z$, where X comprises at least one rare-earth, or Group III B, element. Z is a dopant constituent of the system, which raises the peritectic decomposition temperature ($T_p$) of the oxide.

Although the rare-earth system has the basic formula set out above it may comprise further elements as dopants, impurities or substituents in the system.

Preferably, any dopant, impurity or other element present in the structure, including the dopant Z, should not alter the crystal structure of the rare-earth system, or should not cause any change to the crystal structure which would decrease or negate the seed crystal's utility in superconductor fabrication. Rare-earth oxide systems generally form tetragonal or orthorhombic matrix structures and so a doped material according to the invention should preferably similarly have a tetragonal or orthorhombic matrix structure.

Preferably, the dopant Z comprises Mg.

Preferably, X comprises at least one of the rare-earth elements including Y, La, Ce, Pr, Nd, Pm, Sm, Eu, Gd, Tb, Dy, Ho, Er, Tm, Yb, and Lu. X may comprise two or more of these elements, for instance in one embodiment the system may have a general formula $(Nd, Sm, Gd)_wZ_tBa_xCu_yO_z$.

The invention may thus advantageously provide a seed crystal for promoting controlled, heterogeneous nucleation in an X—Ba—Cu—O melt, thereby increasing the degree of freedom for the fabrication of single-grain or oriented multi-grain superconductors of doped or undoped X—Ba—Cu—O material.

For example, in preferred embodiments the invention may provide methods involving the following steps
a) Mixing Mg-based phases with X—Ba—Cu—O phases and processing the resulting X—Mg—Ba—Cu—O phase to form a melt-processed or single-crystal material to produce a seed crystal;
b) Crystallising an X—Ba—Cu—O material with controlled orientation using a X—Mg—Ba—Cu—O seed crystal; and/or
c) Fabricating TSMG bulk single- and/or multi-grain X—Ba—Cu—O in air atmosphere with high $T_c$, $J_c$ and trapped field;
wherein each X is independently selected from a rare-earth element or a combination of rare-earth elements.

By "X—Ba—Cu—O" material and "X—Z—Ba—Cu—O" or "X—Mg—Ba—Cu—O" material this document refers to compounds comprising said X, Ba, Cu, O, Z and/or Mg elements whether only containing those elements or containing further elements as impurities or as part of said compounds.

In a method for making a seed crystal, preferably the dopant Z may be added to the undoped system (i.e. $X_wBa_xCu_yO_z$) in the form of a solid, and particularly preferably in the form of a powder or granules. The dopant Z may be added in the form of the dopant itself, or of a material comprising the dopant such as its oxide or another suitable compound. References in this document to the addition of the dopant should be construed as encompassing these and any other suitable doping methods. The undoped rare-earth oxide may be in any suitable physical state, and which state may depend on the manner of crystallisation to be employed in producing the seed crystal. When the dopant is added, the undoped rare-earth oxide may be in peritectically molten or liquid form, and/or the method of adding Z may comprise a prior step of substantially melting the undoped rare-earth oxide. Alternatively the undoped rare-earth oxide may be in solid form, preferably in powder or granular form. Preferably the grain size of the powder or granules of the dopant Z (or the material containing the dopant Z) and/or of the undoped rare-earth oxide is at least 1 micron, and preferably the maximum grain size of the powder or granules is no more than 105 microns and, more preferably, no more than 75 microns.

Preferably powders of undoped rare-earth oxide and the dopant Z may be mechanically mixed or mixed using a solution-based technique, in the required stoichio metric ratio, and then suitably compacted into the required geometry for processing into a seed crystal, for example by hot or cold uniaxial or isostatic pressing.

Alternatively, the seed crystal may be produced by a method comprising providing in a receptacle a mixture of the undoped rare-earth oxide, $X_wBa_xCu_yO_z$, and the dopant Z; wholly or partially melting the mixture; optionally providing a seed or key to the receptacle; and subsequently manipulating the temperature of the mixture to induce crystallisation.

The undoped rare-earth oxide and dopant Z may be added to the receptacle in solid form and the mixture melted. Alternatively the undoped rare-earth oxide may be melted in the receptacle and solid Z or a solid material comprising the dopant Z then added to the molten material.

A seed or key may be applied to the molten mixture (before or after the dopant Z is added) or added prior to melting the mixture (before or after the dopant Z is added) and the powdered mixture subsequently melted.

Preferably the method of producing a seed crystal comprises melt processing wherein the mixture of undoped rare-earth oxide and dopant Z is heated to a predetermined temperature, and then the melt slowly cooled to induce crystallisation.

Advantageously the mixture is melted to a peritectically molten state (i.e. a partially-molten state above $T_p$).

The undoped rare-earth oxides, X—Ba—Cu—O, mentioned above have melting points between about 980° C. (Yb—Ba—Cu—O) and about 1080° C. (Nd—Ba—Cu—O). To melt a mixture of a rare-earth oxide and a dopant into the peritectically molten state preferably requires heating to within a temperature range between about 30° C. and 220° C. above the melting point of the rare-earth oxide, and processing of the mixture within the peritectically molten state may then be carried out within the same temperature range. Thus, for Yb—Ba—Cu—O melting and processing may advantageously be performed between about 1010° C. and 1200° C., and for Nd—Ba—Cu—O between about 1100° C. and 1300° C.

The mixture may be heated under air, or under oxygen-rich or oxygen-depleted atmospheres, in order to induce decomposition to the peritectically molten state.

For doping other materials, the skilled person would be able to select appropriate melting and processing temperatures and atmospheres.

Manipulation of the temperature is preferably effected, where a seed or key is applied to the mixture, by cooling the seed or key, or the region around the seed or key, at a rate suitable to induce peritectic solidification of the mixture. Preferably cooling is effected at a rate of no more than 6° C. per hour, although a wide range of cooling rates can be used. In general the slower the cooling rate the better, down to a minimum rate of about 0.1° C. per hour.

The crystal growth may be effected under uniform thermal conditions, such as uniform temperature of the molten mixture, or may be effected under a predetermined thermal gradient, in order to control the crystal growth rate.

It has been found that the crystal growth may be effectively performed in atmospheres containing any of a wide range of oxygen concentrations, in particular for Mg-doped seed-crystal materials. In experiments, oxygen concentrations ranging from 0.01 of the oxygen concentration in air to pure oxygen have been used. However, it has been found that the higher the oxygen concentration in the atmosphere during crystallisation, the higher the peritectic decomposition temperature, $T_p$, of the resulting seed-crystal material. Consequently, it is preferred to use oxygen-rich atmospheres, or pure oxygen, to maximise $T_p$ of the seed crystals. Preferably the oxygen concentration, or partial pressure, should be greater than 0.5 atmospheres, and particularly preferably greater than 0.75 atmospheres. In a preferred embodiment, substantially pure oxygen may be used.

It may be noted that crystallisation in an oxygen-rich atmosphere may adversely affect the superconducting properties, or the potential superconducting properties after annealing, of the seed-crystal material but this may not be a significant disadvantage as it is not necessary for a seed crystal itself to be superconducting.

The resultant X—Z—Ba—Cu—O crystal formed by the method may then be annealed at between 300° C. and 700° C., preferably in an oxygen-rich atmosphere, preferably for between 100 and 300 hours, and more preferably for substantially 200 hours. The annealing step may enable transformation of the crystal to the superconducting state. As noted above, however, for use as a seed crystal it is not essential that transformation to the superconducting state is performed. A seed crystal for a superconductor need not itself be superconducting.

In summary, seed crystals may be grown from a doped rare-earth oxide (X—Z—Ba—Cu—O) by any single-crystal crystallisation technique. Crystallisation may be effected by any suitable method employed by those skilled in the art of single-crystal and large-grain fabrication. Suitable methods of growing (crystallising) single crystals include, for example, sintering, grain growth, flux growth, top-seeded growth, solution crystallisation, floating-zone crystallisation, travelling-solvent crystallisation, electrocrystallisation and hydrothermal growth. Each of these techniques is described in detail in Volume 1, Section B2.4.3.3 pages 354-359 of the "Handbook of Superconducting Materials", published by the United Kingdom Institute of Physics, edited by Cardwell & Ginley, the contents of which are incorporated herein by reference.

The resultant Z-doped crystal or grain preferably comprises the same crystal structure as the undoped X—Ba—Cu—O material but with its melting point being greater than the undoped X—Ba—Cu—O material.

The resulting crystal may advantageously consist of a continuous, optionally superconducting, microstructure or matrix (often referred to as the "123" phase due to it having a $XBa_2(Cu, Z)_3O_d$-structure) that contains discrete inclusions of a non-superconducting phase (often referred to as the "211" phase due to having a $X_2BaCuO_5$-structure) and also inclusions containing the dopant Z.

The resultant X—Z—Ba—Cu—O single-grain or multi-grain material may advantageously be used as a seed crystal or key for the growth of X—Ba—Cu—O single-grain superconductors or multi-grain textured superconductors containing grain boundaries with controlled, or known, angles. Suitable seed crystals for a predetermined X—Ba—Cu—O material include the same material, suitably doped, or a doped material with a different X atom or atoms to the predetermined material.

The method of doping Z in X—Ba—Cu—O described for the first aspect of the invention has a significant potential to fabricate seeded superconductors for any X—Ba—Cu—O systems. In particular, it may advantageously allow the fabrication of single-grain light-rare-earth-based X—Ba—Cu—O (XBCO) superconductors, in particular where X is La, Nd, Sm, Eu, and Gd or a mixture of any of these elements in any molar ratio.

In the doping process, suitably the $X_aBa_bCu_cO_d$ is added to the dopant phase to an amount of at least 50% w/w of the mixture which is to form a precursor for melting and crystal growth, preferably at least 60% w/w, more preferably at least 70% w/w, still more preferably at least 80% w/w, and most preferably at least 90% w/w of the total weight of the mixture. In particularly preferred embodiments the $X_aBa_bCu_cO_d$ is added in an amount of at least 90% w/w, and especially at least 99% w/w.

Advantageously Z is Mg. Mg can be added to the system as Mg, MgO or any other suitable Mg-containing compound or Mg-based phase. MgO, Mg or Mg-based phases may be added to an amount of at least 0.01% w/w, preferably at least 0.05% w/w and more preferably at least 0.1% w/w of the total weight of the precursor mixture.

It has been found that MgO, Mg or an Mg-based phase may be added in amounts up to 30% w/w or even 40% w/w without affecting growth of X—Mg—Ba—Cu—O phase superconducting grains or crystals. Too much Mg in the seed crystal may, however, affect the properties of the fabricated superconductor in the region of the seed crystal. For instance, Mg may diffuse into the superconductor and locally reduce T, adjacent to the seeded region. To avoid this, it may be advantageous to have lower levels of Mg in the seed crystal, such as 5% w/w or 2% w/w or less.

Mg as a dopant may have a number of advantageous effects on the rare-earth oxide system.

Advantageously, the presence of Magnesium in the X—Ba—Cu—O unit cell increases the melting point or peritectic temperature $T_p$ of the X—Ba—Cu—O system. Particularly advantageously, a Mg-doped rare-earth oxide system may have its melting point increased sufficiently to act as a seed crystal for an equivalent undoped system.

The X—Z—Ba—Cu—O crystal structure, when Z represents Mg dopant, may advantageously be similar to or compatible with that of an undoped X—Ba—Cu—O crystal structure. Therefore, a seed crystal grown from a doped X—Z—Ba—Cu—O system may be advantageously used to fabricate rare-earth oxide superconductors in controlled and pre-determined orientations.

Following doping, the X—Mg—Ba—Cu—O phase stability with Ba—Cu—O liquid may advantageously be enhanced at elevated temperatures; Ba—Cu—O is the peritectic liquid phase of the system. Enhanced X—Mg—Ba—Cu—O phase stability may advantageously allow a component formed from the X—Mg—Ba—Cu—O system to retain its physical shape or integrity to higher temperatures when heated above the peritectic transition temperature, T. This may advantageously improve the reliability of the melt process where a superconducting component is fabricated from the doped material, whether or not the fabrication incorporates a seeding step.

Preferably a seed crystal embodying the invention may be grown from a material having the basic formula $X_wZ_tBa_xCu_yO_z$, as described above and in which, w is in the range 1 to 4,
t is in the range 0.01 to 2,
x is in the range 1 to 6,
y is in the range 1 to 6, and
z is in the range 3 to 20.

Preferably, w is in the range 1 to 3.
Preferably t is in the range 0.5 to 1, and more preferably is about 1. Preferably, x is in the range 2 to 4.
Preferably, y is in the range 2 to 6.
Preferably z is in the range 4 to 15, more preferably 5 to 12 and particularly preferably 6 to 8.

A seed crystal according to this first aspect of the invention may, advantageously, be used to grow controlled, oriented single- or multi-grain rare-earth-based HTS superconducting systems by the TSMC technique or by any other technique requiring the use of seed crystals. Other techniques where the seed crystal of the invention may find application include, for example, the single-crystal-pulling technique, Bridgman technique and the infiltration and growth process. Doping Mg into undoped rare-earth oxide may advantageously provide a compound with an increased melting point compared with the undoped X—Ba—Cu—O, no substantial change in the crystal structure except altering slightly the lattice parameters of the doped crystal compared to undoped crystal, and increased chemical stability of X—Mg—Ba—Cu—O with X—Ba—Cu—O melt at elevated temperatures.

Seed crystals as herein described, for example grown by a melt-texturing, top-solution or other crystal-growing technique, may be cut or cleaved and their a/b or c-axes identified from the presence of twin-boundaries in their microstructure using polarised-light microscopy. Various crystallographic planes can be identified using X-ray diffractometry and the samples can be cut along these planes, as required. Crystals cut or cleaved in this way are ready for use as seed crystals for growing X—Ba—Cu—O superconducting crystals in a required orientation.

In a second aspect the invention provides a rare-earth oxide material having the basic system formula of $(RE)_w Z_t Ba_x Cu_y O_z$, where (RE) comprises at least one of La, Ce, Pr, Nd, Pm, Sm, Eu, Gd, Tb, Dy, Ho, Er, Tm, Yb and Lu. Z is a dopant constituent which raises the peritectic decomposition temperature ($T_p$) of the oxide, preferably without altering its crystal structure.

Preferably, Z is a dopant material as described in the first aspect of the invention, and the dopant can be added to the undoped rare-earth oxide as previously described. Particularly preferably Z is Mg.

Advantageously,
w is in the range 1 to 4,
t is in the range 0.01 to 2,
x is in the range 1 to 6,
y is in the range 1 to 6, and
z is in the range 3 to 20.
Preferably, w is in the range 1 to 3.
Preferably t is in the range 0.5 to 1, and more preferably is about 1.
Preferably, x is in the range 2 to 4.
Preferably, y is in the range 2 to 6.
Preferably z is in the range 4 to 15, more preferably 5 to 12 and particularly preferably 6 to 8.

A material according to this second aspect of the invention may advantageously be used to grow a seed crystal for use in the fabrication of a rare-earth oxide superconductor. For use as a seed crystal the material is advantageously based on a light-rare-earth (LRE) barium copper oxide system or on a mixed-rare-earth barium copper oxide system, for example a system with the basic formula $Nd_w Z_t Ba_x Cu_y O_z$, $Sm_w Z_t Ba_x Cu_y O_z$, or $(Y, Nd)_w Z_t Ba_x Cu_y O_z$.

In a further aspect, the invention may advantageously provide a method of fabricating a bulk superconductor of predetermined grain orientation. This method preferably comprises the steps of selecting a superconductor material, selecting a seed crystal according to the first aspect of the invention or grown from a material according to the second aspect of the invention, and arranging or providing the seed crystal in contact with the superconductor material in a desired crystallographic orientation such that, during processing, grain growth in the superconductor material is initiated in that orientation.

Advantageously the bulk superconductor is a rare-earth barium copper oxide superconductor of the general formula $X_a Ba_b Cu_c O_d$, where X comprises at least one rare-earth element. Preferably the bulk superconductor is substantially isostructural with the selected seed crystal.

Preferably X comprises at least one of Y, La, Ce, Pr, Nd, Pm, Sm, Eu, Gd, Tb, Dy, Ho, Er, Tm, Yb, and Lu. Particularly preferably X comprises at least one of the light-rare-earth elements, such as Nd, Sm, Pr, Eu, Gd or La, or X comprises two or more rare-earth elements, advantageously including one or more of the light-rare-earth elements. As described above, rare-earth barium copper oxides based on LRE elements or mixed-rare-earth elements may have superior superconducting properties when compared with commonly-available yttrium barium copper oxide based superconductors.

Preferably the selected seed crystal has a higher melting point than the superconductor. The method may be put into practice where there is no difference or a minimal difference in melting point between the seed crystal and the superconductor by using a hot-seeding technique, but the invention provides greater advantage when there is a sufficient difference between the melting point of the selected seed and the superconductor to enable a cold seed fabrication technique such as TSMG to be used. A cold TSMG technique obviates the need for a specially-designed hot-seeding furnace and furthermore may allow for improved control of the orientation and positioning of the seed crystal in relation to the superconductor.

Advantageously the superconductor material has the general formula $X_a Ba_b Cu_c O_d$ where X is as defined above and a is in the range 1 to 4, b is in the range 1 to 6, c is in the range 1 to 6, and d is in the range 3 to 20.
Preferably a is in the range 1 to 3.
Preferably b is in the range 2 to 4.
Preferably c is in the range 1 to 3.
Preferably d is in the range 4 to 15, more preferably 5 to 12 and most preferably 6 to 8.

Crystallisation of the bulk superconductor material may be effected by any suitable method, including for example any method described above for the crystallisation of a seed crystal.

Optionally, fabrication of a bulk superconductor may comprise crystallisation of a mixture of secondary phase particles of $X_2 BaCuO_5$ and/or $X_2 Ba_4 CuLO_y$ phases [where L comprises U, Nb, Ta, Mo, W, Zr, Hf, Ag, Pt, Sb, Sn, Bi, In and/or Ce] in molten $X_a Ba_b Cu_c O_d$. These secondary-phase particles may induce the formation of nano-inclusions in the superconductor matrix.

It is known to add Ag to Y—Ba—Cu—O precursor powders to improve the mechanical strength of a single-grain superconductor. However, fabrication of Ag-containing bulk YBCO single grains by the prior art "cold seeding" process is particularly problematic, due primarily to diffusion of Ag into the Nd—Ba—Cu—O or Sm—Ba—Cu—O seed crystal at elevated temperatures. This reduces the melting point of the seed crystal, which, in turn, leads to the formation of unwanted multiple nuclei at the position of the partially-molten seed. Conventionally, the so-called hot-seeding method is employed to solve this problem. The inventors have established, however, that $Nd_w Z_t Ba_x Cu_y O_z$ (and, in general, $(RE)_w Z_t Ba_x C_y O_z$) performs effectively as a seed crystal in the cold-seeding process (which as described above is a more practical method than, and therefore preferable to, the hot-seeding method) for any precursor composition (i.e. irrespective of the elements or phases added to the precursor) including compositions comprising Ag or $Ag_2 O$.

In particular, therefore, $(RE)_w Z_t Ba_x Cu_y O_z$ may advantageously provide an effective seed crystal for a composition with general formula $X_a Ba_b Cu_c O_d + X_2 Ba_4 CuO_5 + X_2 Ba_4 CuLO_y + Ag$.

A method of fabricating a superconductor according to a preferred embodiment of the invention comprises providing in a receptacle a mixture of or including $X_a Ba_b Cu_c O_d$ and $X_2 BaCuO_5$ and X—Ba—Cu-L-$O_y$ phases [where L comprises at least one of U, Nb, Ta, Mo, W, Zr, Hf, Ag, Pt, Sb, Sn, Bi, In and Ce]; melting the mixture; providing a seed or key, or multiple seeds or keys, to the receptacle; and subsequently manipulating the temperature of, or in the region of, the seed or key, to induce crystallisation of the molten mixture.

Preferably the mixture is melted to a peritectically molten state (i.e. partially-molten state). To do this, preferably the mixture of $X_a Ba_b Cu_c O_d$ and X—Ba—Cu-L-$O_y$ phases is heated to at least 1000° C., more preferably at least 1050° C. and most preferably at least 1100° C., but preferably to no more than 1150° C.

The mixture may be heated under air, oxygen-rich, or oxygen-depleted atmospheres in order to induce decomposition to the peritectically molten state.

Manipulation of the temperature is preferably effected by cooling the X—Mg—Ba—Cu—O single seed, multiple seeds or the region(s) around the seed(s) at a rate suitable to induce peritectic solidification of the mixture. Suitably, cooling is effected at a rate of no more than 6° C. per hour, preferably no more than 5° C. per hour. Suitably cooling is effected at a rate of at least 0.05° C. per hour, preferably at least 0.075° C. per hour and more preferably at least 0.1° C. per hour.

The crystal growth may be effected under uniform thermal conditions, such as uniform temperature of the molten mixture, or may be effected under a thermal gradient, in order to control the crystal growth rate.

The resultant X—Ba—Cu—O crystal or grain consisting of $X_2BaCuO_5$ and X—Ba—Cu-L-$O_y$ phase inclusions is then annealed, preferably at between 300° C. and 700° C. and preferably in an oxygen-rich atmosphere. Annealing is carried out preferably for between 100 and 300 hours, and more preferably for substantially 200 hours. The annealing step advantageously enables transformation of the compound to the superconducting state.

As is known to the person skilled in the art, if the bulk superconductor material is sensitive to oxygen, the crystal-growth step for the bulk superconductor may advantageously be carried out under a low-oxygen, or reduced-oxygen, atmosphere in order to enhance the superconducting properties of the material. However, in a further aspect of the invention, in order to fabricate in an air atmosphere a superconductor based on a rare-earth material that is sensitive to oxygen, excess Ba may advantageously be added. Excess Ba is believed to suppress the formation of $(RE')_{1+x} Ba_{2-x}CuO_y$, where RE' comprises La, Nd, Sm, Gd or Eu, when X—Ba—Cu—O is melt-processed in air.

The Top Seeded Melt Growth technique described in Cardwell [Mater. Sci. Eng. B53, 1 (1998)] is generally used for fabrication of single-grain superconductors. YBCO (Y—Ba—Cu—O) single-grain superconductors have been processed successfully in air using the TSMG method. However, a problem arises in melt processing of NdBaCuO, SmBaCuO, GdBaCuO or mixed-rare-earth barium cuprates, for example (Nd, Eu, Gd)Ba—Cu—O superconductors, which has to be performed under a controlled atmosphere to suppress solid-solution formation. For example the apparatus described in detail in *Journal of Material Science Letters*, 14, p1444 (1995) would disadvantageously have to be modified accordingly. In addition to this, since no suitable seed crystal is available to cold-seed the material, development of high-potential light-rare-earth-based superconductors for engineering applications has not been progressed very far.

It is found experimentally that suppression of (LRE)/Ba solid-solution phase formation has been achieved through addition of a small amount of $BaO_2$ to a precursor body of X—Ba—Cu—O.

In a preferred embodiment, $BaO_2$ can be added in concentrations of up to 20 to 30 mol % to the mixture of $XBa_2Cu_3O_y+X_2BaCuO_5+$X—Ba—Cu-L-$O_y$ to suppress X/Ba solid solution formation. Preferably 10 mol % of $BaO_2$ can be added and more preferably 5 mol % can be added without substantially affecting the melt-processing conditions.

It is similarly possible to enrich with Ba a material as described above for fabricating seed crystals. However, there is less advantage in doing so because it may not be necessary to produce superconducting properties in seed crystals. In fact it may be disadvantageous to enrich a seed crystal material with Ba as this may decrease the proportion of the desirable matrix phase in the seed crystals.

Using the X—Z—Ba—Cu—O seed crystal described above and enriching the X—Ba—Cu—O+$X_2BaCuO_5$+X—Ba—Cu-L-$O_y$ mixture with $BaO_2$, large-grain superconductors with required orientations have been processed successfully in an air atmosphere (see Example 3 below). These superconductors exhibit advantageously high $T_c$, high $J_c$ and high trapped magnetic-field.

This method may thus advantageously allow fabrication of large-grain superconducting materials, and particularly LRE superconducting materials, in air with good superconducting properties, for example in a simple box-type furnace, which are economical and also offer a significant degree of freedom in terms of processing and reproducibility in growth of oriented grains.

DESCRIPTION OF SPECIFIC EMBODIMENTS AND BEST MODE OF THE INVENTION

Specific embodiments of the invention will now be described by way of example, with reference to the accompanying drawings in which;

FIG. 1 is a diagram of a top-seed melt-processing (TSMG) apparatus, in which a single crystal of X—Ba—Cu—O, or X—Ba—Cu—O doped with or without X—Ba—Cu-L-$O_y$ phase particles [where L comprises U, Nb, Ta, Mo, W, Zr, Hf, Ag, Pt, Sb, Sn, Bi, In and/or Ce] can be crystallised using a X—Mg—Ba—Cu—O seed crystal. A similar apparatus is described in detail in *Journal of Material Science Letters*, 14, p1444 (1995), which is incorporated herein by reference in its entirety;

FIG. 2 is a plot of differential-thermal-analysis (DTA) results against temperature for Nd—Ba—Cu—O phases mixed with 0 to 20 wt % MgO. It can be clearly seen that the presence of Mg increases the melting point of the Nd—Ba—Cu—O system by at least 20° C. The Figure also shows (as the topmost trace in the plot) the DTA signal of a melt-processed Nd—Mg—Ba—Cu—O single-grain crystal showing that the melting point increases by 20° C. compared to that of single-crystal Nd—Ba—Cu—O;

Figure 1:
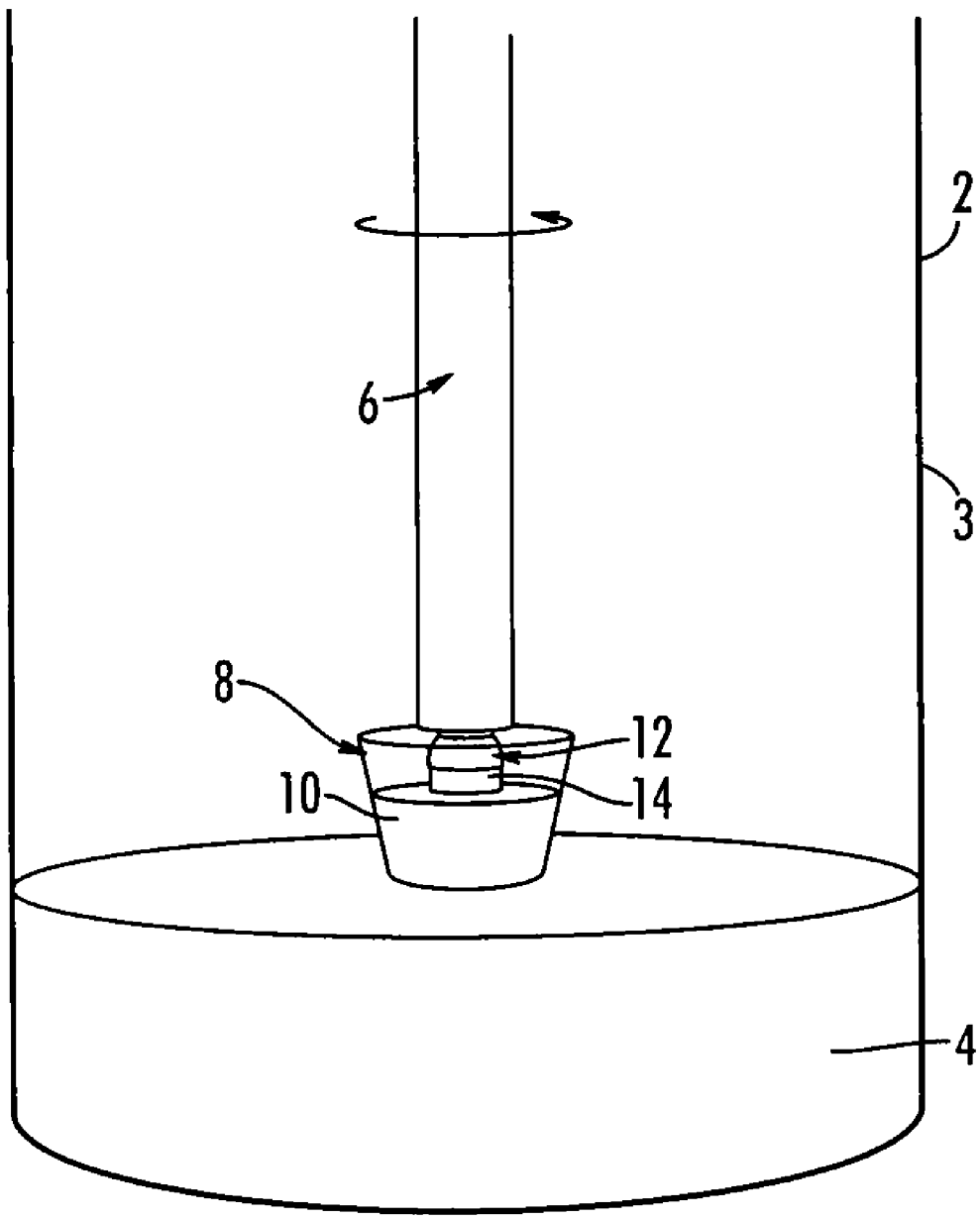

FIG. 1 illustrates a top-seed melt-growth apparatus 2 consisting of a pedestal 4 on which is mounted a furnace chamber 3, connected to an energy supply to enable heating to be effected within the furnace 3. Within the furnace chamber is a seed-holder arm 6 arranged such that its distal end can be positioned within a melt receptacle 10 located on the pedestal. At the end of the arm is a seed crystal, or seed, 12 that is arranged to be lowered into the melt receptacle during use. The seed-holder arm is rotatable, and is such that rotation may be effected during growth of a superconductor crystal 14. The airspace within the furnace is a controlled atmosphere, the temperature of which may be adjusted as desired. The seed arm is also movable upwardly and downwardly with respect to the pedestal, such that during growth of the crystal, the seed arm may be retracted slowly from the melt receptacle, in order that further growth of the crystal may be effected and a continual temperature gradient of the seed and the crystal effected in order to enable continued growth of the crystal. FIG. 1 shows the seed being raised from the melt and a growing crystal connected to the seed, growing in a melt solution present within the melt receptacle.

In alternative embodiments of the apparatus 2, a cold finger may be used to control grain nucleation and growth. In a further embodiment, the seed may be placed on an exposed surface of a precursor-pellet compact at room temperature, rather than at elevated temperature after melting or partial melting of the compact in the receptacle. In this case the seed need not be carried by the seed arm, which therefore need not be used.

Example 1

Figure 2:
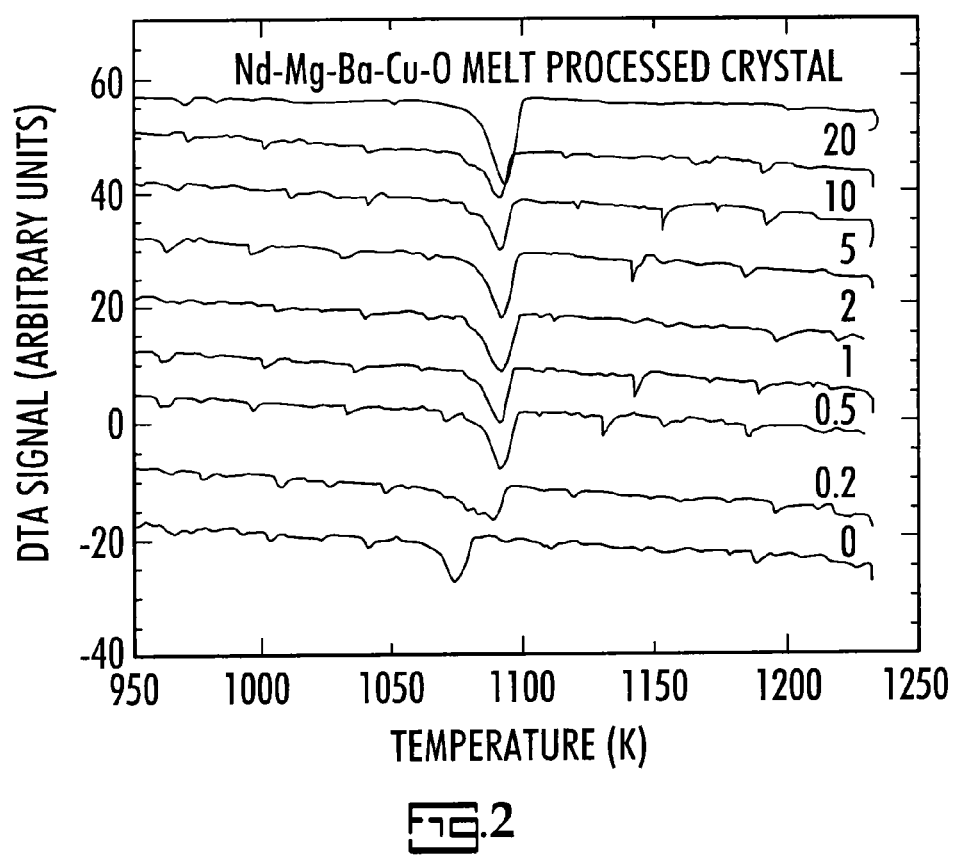

Development of a Generic Seed Crystal for the Purpose of Seeding X—Ba—Cu—O Superconductors $NdBa_2Cu_3O_y$ +12 mol % $Nd_4Ba_2Cu_2O_{10}$ (Nd-422) phase powders were mixed and then enriched with various amounts of MgO phase ranging from 0 to 20 wt %. Differential thermal analysis (DTA) on these mixed powders show (FIG. 2) an increased melting point of Mg-doped NdBCO compared to that of undoped NdBCO.

Each mixture was pressed into a precursor-pellet compact, an MgO seed crystal was placed on top of the pellet and the pellet and seed crystal together were placed in the melt receptacle 10. The receptacle was placed on the pedestal 4 of the top-seed melt apparatus 2 shown in FIG. 1. In this example of the TSMG technique, the MgO seed crystal has a melting point which is sufficiently higher than that of the pellet material that it is not necessary to use the seed arm of the apparatus of FIG. 1 to carry the seed crystal; the seed crystal can simply be placed on top of the pellet before the pellet is melted.

The powder constituents in the melt receptacle were heated to a temperature of 1150° C., in order to melt the powdered mixture into a peritectically molten state. The melt and seed were then cooled at a rate of 150° C./h to 1100° C. and then slowly cooled at the rate of 0.5° C. per hour to 1050° C./h in order to effect crystallisation of the melt in the melt receptacle. In this example, the melt-processing was carried out in air. In general, a wide range of atmospheres may be used for preparing seed-crystal materials embodying the invention, such as air, or oxygen at any partial pressure.

Upon complete crystallisation, the single crystal or grain produced was then subjected to an oxygen-rich atmosphere at a temperature of between 300° C. and 700° C. for 200 hours in order to anneal the crystal to enable transformation of the crystal or grain to the superconducting state. The annealing step can, however, be omitted where the aim of the procedure is to prepare seed crystals of superconductor growth, which need not themselves be superconducting.

For each of the mixtures processed, the resultant superconducting material was shown to consist of a primary superconducting-phase microstructure of a (Nd, Mg)-123 phase which contained discrete inclusions of a non-superconducting Nd-422 phase and MgO phase particles.

Small crystals were cut or cleaved along ab-planes to use as seed crystals. Because of the lattice mismatch between the MgO seed crystal and the $NdBa_2Cu_3O$, materials in the pellets, randomly-oriented single-grain materials are formed after melt processing, but this is not a problem as in this Example the materials are for preparing seed crystals rather than bulk superconductors.

Figure 3:
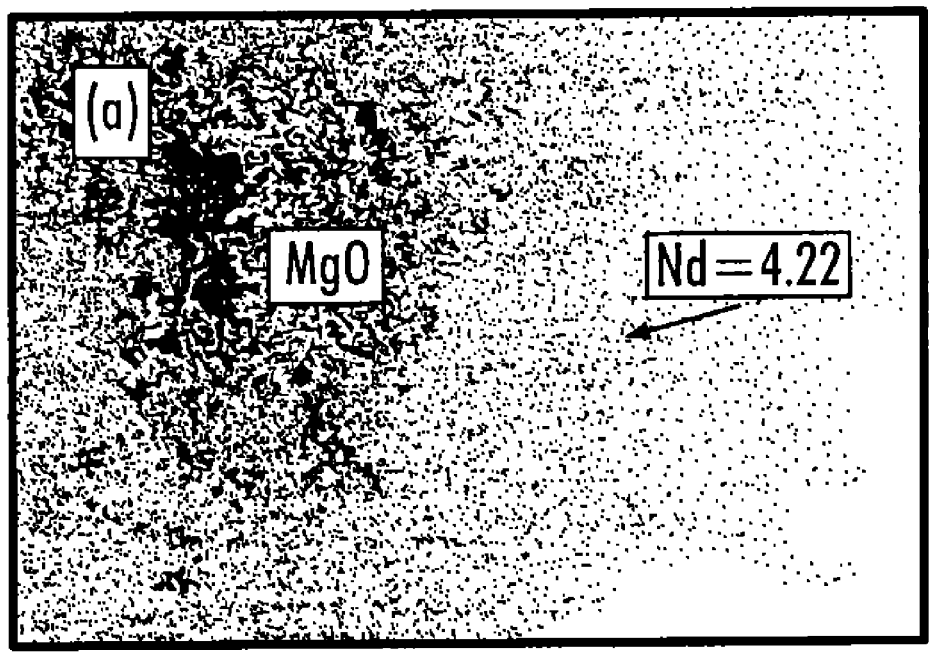
FIG. 3 shows polarised-light micrographs of the microstructure of X—Mg—Ba—Cu—O melt-processed superconductor containing (a) 1 wt % MgO and (b) 10 wt % MgO (the scale is the same in each micrograph)
Figure 3:
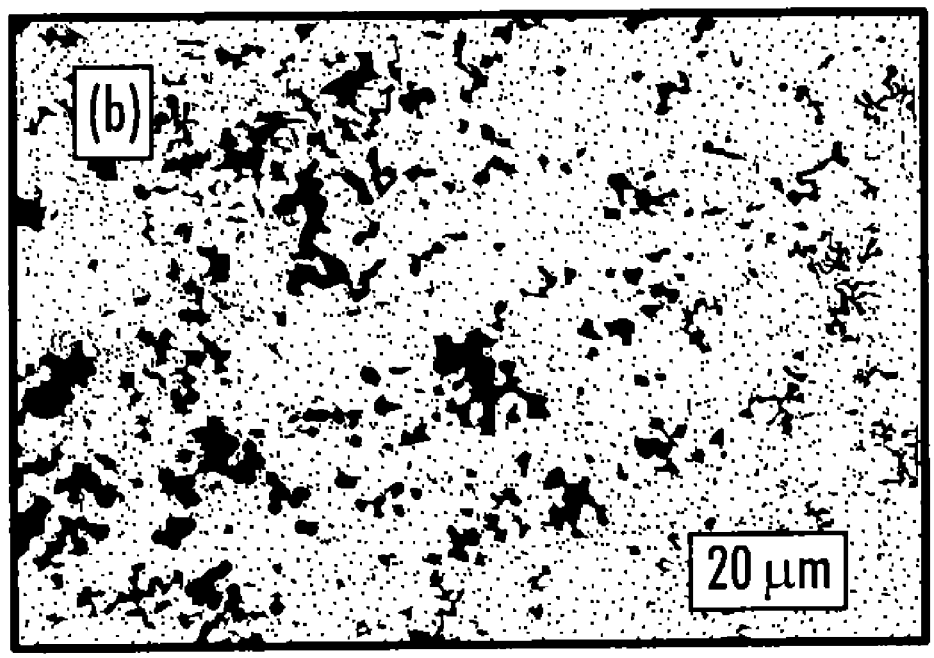

The microstructures of two of the resultant seed crystals are shown in FIG. 3, which were photographed on an Olympus® polarised-light microscope. FIG. 3(a) shows a crystal doped with 1 wt % MgO and FIG. 3(b) shows a crystal doped with 10 wt % MgO. Dark-in-contrast regions show approximately the position of the MgO phase particles, dark-grey-in-contrast regions show approximately the position of Nd-422 phase particles and the light-grey-in-contrast region shows the (Nd, Mg)-123 superconducting matrix.

Example 2

Fabrication of Nd—Ba—Cu—O, Sm—Ba—Cu—O and Y—Ba—Cu—O Superconductors Using a Nd—Mg—Ba—Cu—O Seed Crystal Cylindrical-shaped precursor pellets were made from the starting compositions (a) Nd-123+15 mol % Nd-422 (b) Sm-123+30 mol % Sm-211 and (c) Y-123+30 mol % Y-211.

Nd—Mg—Ba—Cu—O crystals processed as in Example 1 were cleaved and cut into small 2 mm×2 mm×0.5 mm sized crystals. The thickness along the c-axis of these crystals is about 0.5 mm. The ab-planes of seed crystals were then placed on top of precursor pellets of each of the compositions described above and melt-processed as described in Example 1 (including the annealing step) in both air and reduced oxygen-partial-pressure. In each case, however, the maximum temperature used to melt the precursor pellet was about 10° C. below the melting point of the seed crystal, in order to avoid melting of the seed crystal. As in Example 1, each seed crystal in this case has a melting point which is sufficiently higher than that of the pellet material that it is not necessary to use the seed arm of the apparatus of FIG. 1 to carry the seed crystal.

Figure 4:
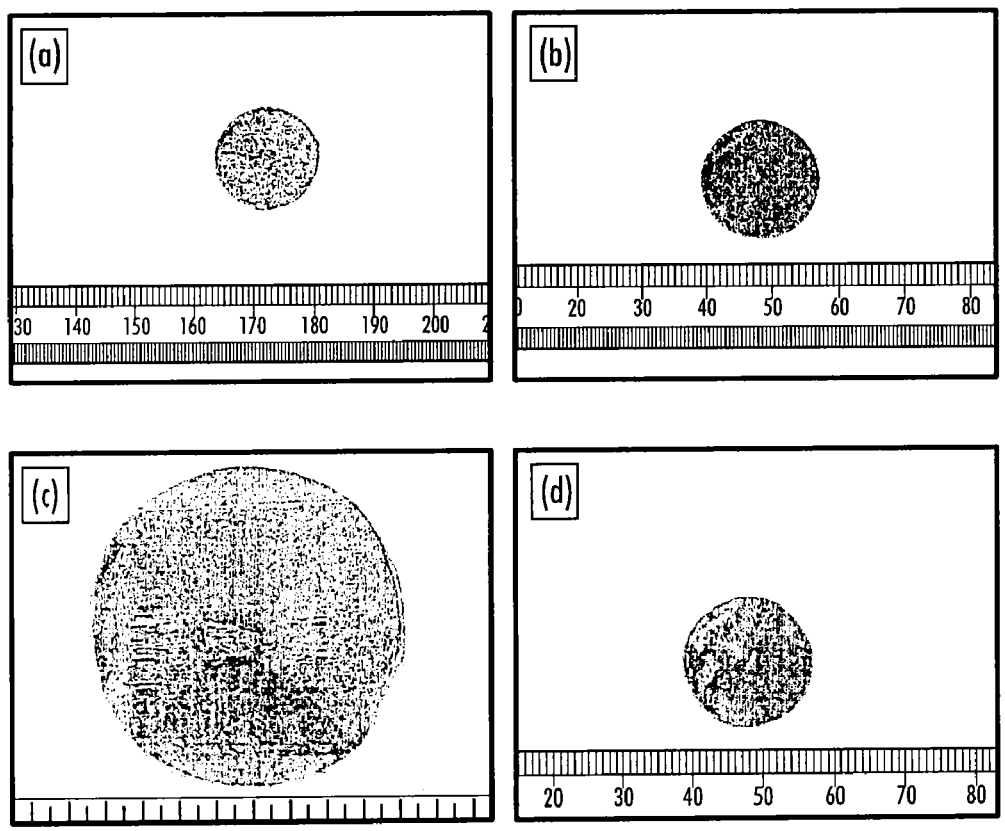
FIG. 4 shows top views of single-grain bulk superconductors of (a) Y—Ba—Cu—O and (b) Sm—Ba—Cu—O systems processed in air, (c) Sm—Ba—Cu—O system processed in 0.1% $O_2$ in $N_2$ atmosphere and (d) NdBCO system processed in air seeded with Nd—Mg—Ba—Cu—O seed crystal.

Initially, just below $T_p$, in each case a heterogeneous nucleus formed from the melt underneath the seed crystal, which grew subsequently into a large grain or crystal whilst maintaining the same orientation as the seed crystal; the orientation matching is advantageously achieved because of the substantially-perfect crystallographic-lattice matching with the seed crystal. The ab-planes of all the seeded samples were observed to be parallel to the top surface of the cylindrical pellet. The top views of a number of pellets, showing the single-grain growth under Mg—Nd—Ba—Cu—O seed crystals, are shown in FIG. 4. The square shape in FIG. 4(b) clearly suggests that the ab-plane of these crystals is parallel to the top surface of the sample. This type of configuration is favourable in terms of maximising the field-trapping ability of the superconductor, given that the ab-plane critical current-density is always higher than the ac-plane critical current-density, giving rise to a large trapped field along the c-axis of the crystal or grain.

Example 3

Fabrication of Nd—Ba—Cu—O and Sm—Ba—Cu—O Single Grain Bulk Superconductors in an Air Atmosphere with High $T_C$, $J_c$ and Trapped Fields A small amount (2 mol %) of $BaO_2$ was mixed with (a) Nd123+15 mol % Nd-422 and (b) Sm123+30 mol % Sm-211. These mixtures were pressed into cylindrical pellets using a uniaxial press.

Small-sized Nd—Mg—Ba—Cu—O seed crystals of composition Nd-123+1 wt % MgO and dimensions of about a=2 mm×b=2 mm×c=1 mm were placed on top of these pellets and melt processed in an air atmosphere as described in Examples 1 and 2. In each case, however, the maximum temperature used to melt the pellet was about 10° C. below the melting point of the seed crystal, in order to avoid melting of the seed crystal. Seed crystals with lower and higher concentrations of MgO and larger and smaller sizes were also tested and found to work well, achieving growth of single- or multi-grain $XBa_2Cu_3O_{7-\delta}$ with controlled orientation.

The resultant single-grain materials were annealed in an $O_2$ atmosphere in the temperature range of 350-300° C. for 100 hours to transform them to the superconducting state.

Figure 5:
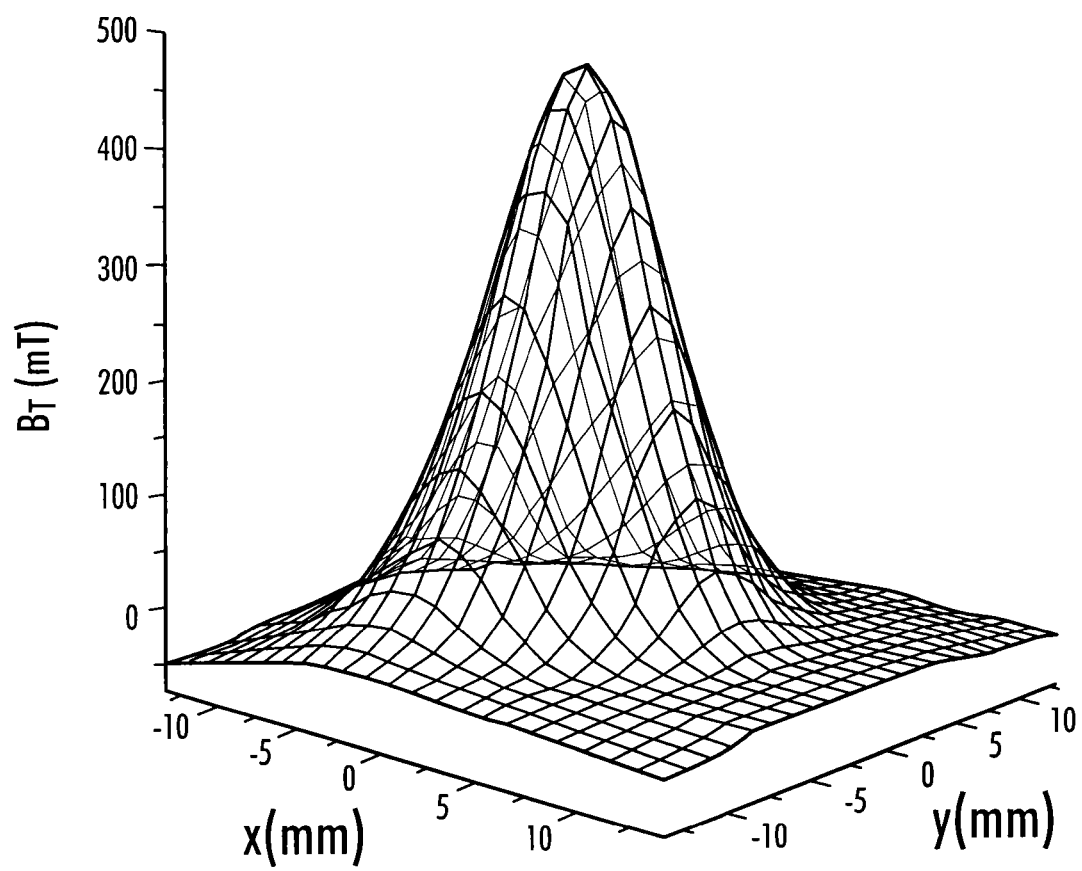
FIG. 5 illustrates a trapped-field profile of a 1 cm$^2$ single-grain superconductor as described in Example 3.

FIG. 5 illustrates a trapped-field profile of the Sm—Ba—Cu—O crystal produced. This profile was obtained using a custom-made apparatus, comprising a magnet, power supply, X-Y-Z scanner and a Hall probe. A single-grain superconductor of Example 3 was magnetised under a magnetic field of 0.5 T and then the field was removed. The trapped field was measured using a Hall probe on the X-Y plane (top surface) of the sample surface, at 0.5 mm from the sample centre. A (maximum) trapped field of about 0.48 T is obtained for 1 cm sized crystal. This is the first time such a high trapped field has been observed in a LRE based superconductor fabricated in air using the TSMG method. (Although a custom-made apparatus was used in this experiment, the results would be easily reproducible by the skilled person.)

The single-grain NdBCO and SmBCO superconductors were later cut into small pieces and their $T_c$ measured as a function of distance from the centre to the edge of each sample. $T_c$ was found to be around 95 K for NdBCO and around 92 K for SmBCO, in each case with a transition width of <1 K. It is known that if Nd/Ba or Sm/Ba solid solutions form within these samples, $T_c$ decreases dramatically well below 95 K for NdBCO and 92 K for SmBCO. The observed high $T_c$ values in these samples suggests that the method of this Example succeeded in fabricating advantageously solid-solution-free NdBCO and SmBCO superconductors.

Example 4

Multi-Seeding with Controlled Orientation

A multi-seeding technique is generally employed for the Y—Ba—Cu—O system either in order to process large grains at an increased rate, or in order to fabricate complex geometries composed of oriented multi-grains. The cold-seeding processing technique is preferred for processing such samples in view of the simplicity and ease of placing the seed crystals at the required sites on a precursor pellet at room temperature (i.e. prior to melt processing). To date, however, it has not been possible to fabricate multi-seeded, oriented, single grains of (LRE)BCO due to the lack of availability of a seed crystal that can be used in a cold-seeding process for these materials. "Hot seeding" cannot be employed easily in a multi-seeding process due to the complexity in handling the seeds at elevated temperature.

In this Example, multi-grain, oriented (LRE)-Ba—Cu—O bulk superconductors have been successfully processed using a multi-seeded process. This was achieved by placing several $(Nd)_wZ_tBa_xCu_yO_z$ seed crystals on the top surface of a $X_aBa_b$-$CuO_d+X_2BaCuO_5+X_2Ba_4CuLO_y+Ag$ or $Ag_2O$ precursor pellet and melt-processing the arrangement with the procedure described in Examples 2 and 3.

Multiple-seeded grains nucleated simultaneously in this process in the required orientation at the positions of the seed crystals. This multi-seeding process may advantageously play a significant role in fabrication of large tiles of high performance (LRE)-Ba—Cu—O superconductors for engineering applications.

Example 5

Effect of Oxygen Content of Processing Atmosphere

Figure 6:
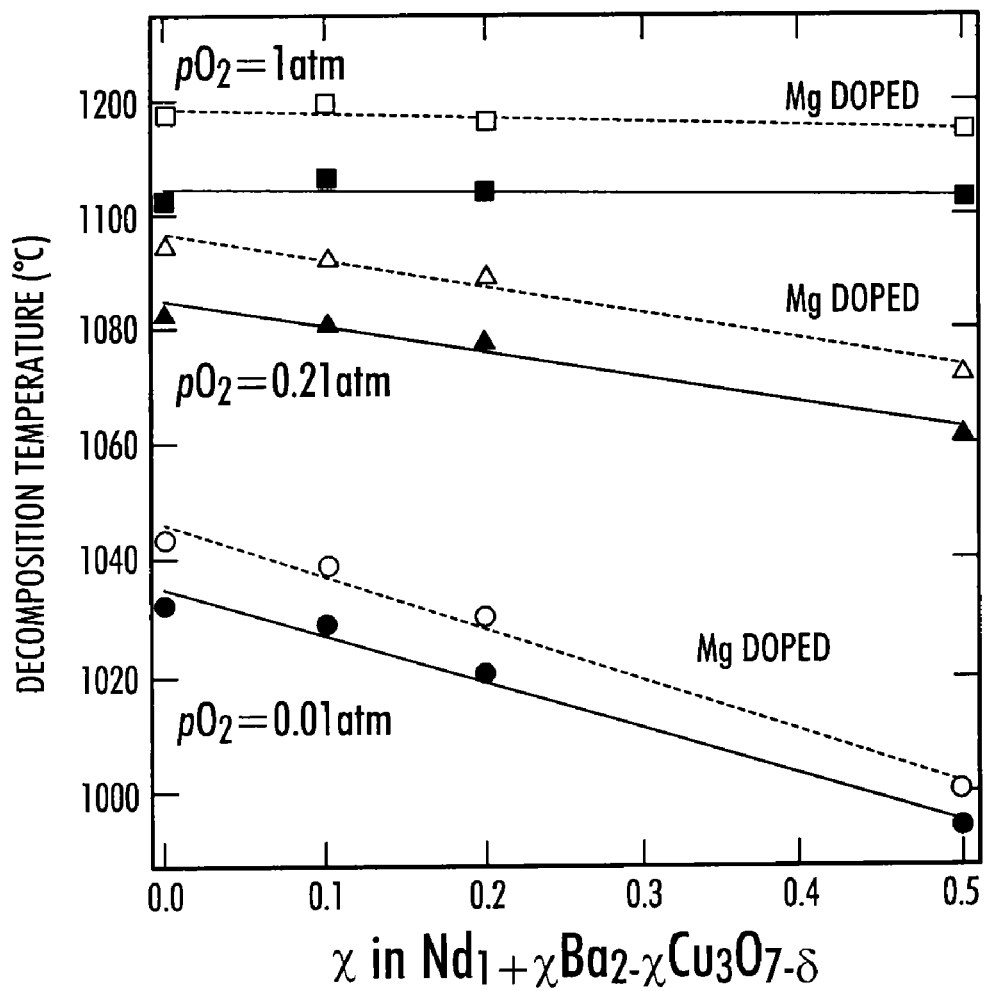
FIG. 6 is a plot of peritectic decomposition temperature, $T_p$, for different compositions of $Nd_{1+x}Ba_{2-x}Cu_3O_{7-\delta}$, both undoped and Mg-doped, where crystal growth has been performed under different oxygen partial pressures.

FIG. 6 is a plot of peritectic decomposition temperature, $T_p$, against x for different compositions of $Nd_{1+x}Ba_{2-x}Cu_3O_{7-\delta}$. The crystal-growth process for different material compositions was performed under three different atmospheres, containing partial pressures of oxygen, $pO_2$, of 0.01 atmospheres, 0.21 atmospheres and 1.0 atmosphere. Each material composition (each value of x) was also tested with and without Mg doping; the doping level used was 2 wt %. The dashed lines in FIG. 6 represent Mg-doped samples and the neighbouring solid lines the corresponding undoped materials. As can clearly be seen from FIG. 6, increasing the oxygen level in the atmosphere during crystal growth increases the peritectic decomposition temperature, $T_p$, of the crystal formed, as does doping with Mg. Increased $T_p$ is particularly desirable for seed crystals and so this Example demonstrates the advantages of Mg doping for seed crystal formation, including the ability to form Mg-doped seeds in a range of $O_2$ partial pressures, as well as the advantages of crystal growth under an oxygen-rich, or pure oxygen, atmosphere for seed-crystal formation.

The invention claimed is:

1. A method of fabricating a superconductor of predetermined grain orientation comprising the steps of;
   selecting a superconductor material;
   selecting a seed crystal grown from a rare-earth oxide having the basic formula $(RE)_wZ_tBa_xCu_yO_z$;
   where (RE) comprises at least one rare earth element;
   where w is in the range 1 to 4, x is in the range 1 to 6, y is in the range 1 to 6 and z is in the range 3 to 20; and
   Z is a dopant which raises the peritectic decomposition temperature ($T_p$) of the oxide, in which Z comprises Mg and in which the rare-earth oxide contains less than 40% w/w of Mg; and,
   arranging the seed crystal in contact with the superconductor material in a desired crystallographic orientation such that, during processing, grain growth in the superconductor material is initiated in a predetermined orientation.

2. A method according to claim 1 in which the superconductor material comprises a rare-earth barium copper oxide of the general formula $X_aBa_bCu_cO_d$;
   where X comprises at least one rare-earth element.

3. A method according to claim 2, in which
   X comprises at least one of Y, La, Ce, Pr, Nd, Pm, Sm, Eu, Gd, Tb, Dy, Ho, Er, Tm, Yb, and Lu.

4. A method according to claim 2, in which;
   a is in the range 1 to 4,
   b is in the range 1 to 6,
   c is in the range 1 to 6, and
   d is in the range 3 to 20.

5. A method according to claim 4, in which a is in the range 1 to 3.

6. A method according to claim 4, in which b is in the range 2 to 4.

7. A method according to claim 4, in which c is in the range 1 to 3.

8. A method according to claim 4, in which d is in the range 6 to 8.

9. A method according to claim 1 in which the selected seed crystal has a higher melting point than the selected superconductor material.

10. A method according to claim 1, in which the selected seed material is iso-structural with the selected superconductor material.

11. A method according to claim 1, in which the superconductor material comprises excess Ba, enabling processing of the superconductor material in air.

12. A superconductor fabricated by a method according to claim 1.

13. A method according to claim 1, in which (RE) comprises at least one of Y, La, Ce, Pr, Nd, Pm, Sm, Eu, Gd, Tb, Dy, Ho, Er, Tm, Yb, and Lu.

14. A method according to claim 1, in which t is in the range of 0.01 to 2.

15. A method according to claim 1, in which
w is in the range 1 to 3, and/or
x is in the range 2 to 4, and/or
y is in the range 2 to 6, and/or
z is in the range 6 to 8, and/or
t is in the range 0.5 to 1.

* * * * *